(12) United States Patent
Groshong et al.

(10) Patent No.: US 7,242,202 B2
(45) Date of Patent: Jul. 10, 2007

(54) SIGNAL PROBE AND PROBE ASSEMBLY

(75) Inventors: Joseph Groshong, Colorado Spring, CO (US); Brock J. LaMeres, Colorado Springs, CO (US); Brent A. Holcombe, Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/141,500

(22) Filed: May 31, 2005

(65) Prior Publication Data

US 2006/0267606 A1 Nov. 30, 2006

(51) Int. Cl.
*G01R 1/073* (2006.01)

(52) U.S. Cl. .................. 324/754; 324/761
(58) Field of Classification Search ............... None
See application file for complete search history.

(56) References Cited

U.S. PATENT DOCUMENTS

| | | | | |
|---|---|---|---|---|
| 2,662,953 A * | 12/1953 | Barker | ............ | 337/187 |
| 3,243,551 A * | 3/1966 | Hollins | ............ | 337/195 |
| 4,734,059 A * | 3/1988 | Melugin | ............ | 439/621 |
| 4,739,259 A * | 4/1988 | Hadwin et al. | ............ | 324/761 |
| 4,909,761 A * | 3/1990 | Muguira | ............ | 439/622 |
| 5,583,447 A | 12/1996 | Dascher | | |
| 5,772,473 A * | 6/1998 | Cheng et al. | ............ | 439/621 |
| 5,888,098 A * | 3/1999 | Cheng et al. | ............ | 439/621 |
| 6,030,254 A * | 2/2000 | Johnson et al. | ............ | 439/496 |
| 6,049,219 A * | 4/2000 | Hwang et al. | ............ | 324/765 |
| 6,175,228 B1 * | 1/2001 | Zamborelli et al. | ............ | 324/72.5 |
| 6,225,816 B1 * | 5/2001 | Draving et al. | ............ | 324/754 |
| 6,362,614 B2 * | 3/2002 | Draving | ............ | 324/72.5 |
| 6,407,562 B1 * | 6/2002 | Whiteman | ............ | 324/754 |
| 6,483,284 B1 * | 11/2002 | Eskeldson et al. | ............ | 324/72.5 |
| 6,788,090 B2 * | 9/2004 | Aihara | ............ | 324/765 |
| 6,822,466 B1 | 11/2004 | Holcombe et al. | | |
| 6,867,609 B2 | 3/2005 | Holcombe et al. | | |
| 7,046,020 B2 | 5/2006 | LaMeres et al. | | |
| 2006/0022692 A1 | 2/2006 | LaMeres et al. | | |
| 2006/0033514 A1 | 2/2006 | LaMeres et al. | | |

OTHER PUBLICATIONS

Hewlett Packard "10:1 Voltage Divider Probe", Operating Note/Jun. 1969.
Hewlett Packard, "Probes", Operating Note/Jun. 1970.

* cited by examiner

*Primary Examiner*—Ernest Karlsen

(57) ABSTRACT

A probe includes an electrical element. The probe has reduced parasitic loading. A probe assembly with a plurality of probes is also disclosed.

8 Claims, 8 Drawing Sheets

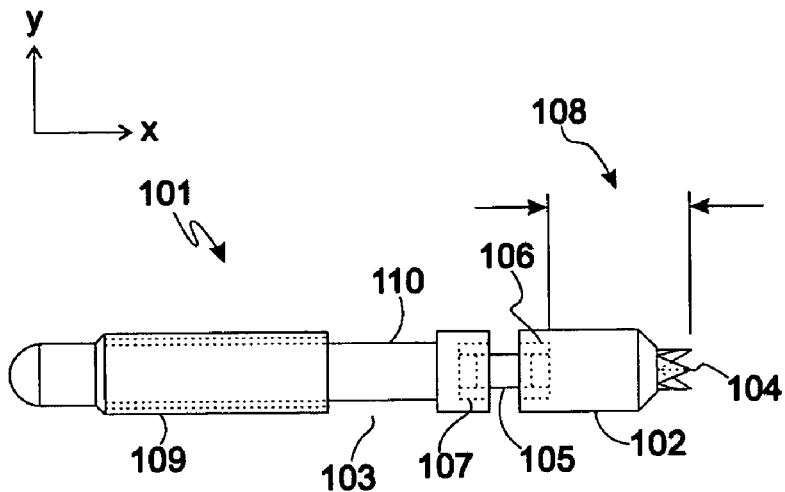
FIG. 1A
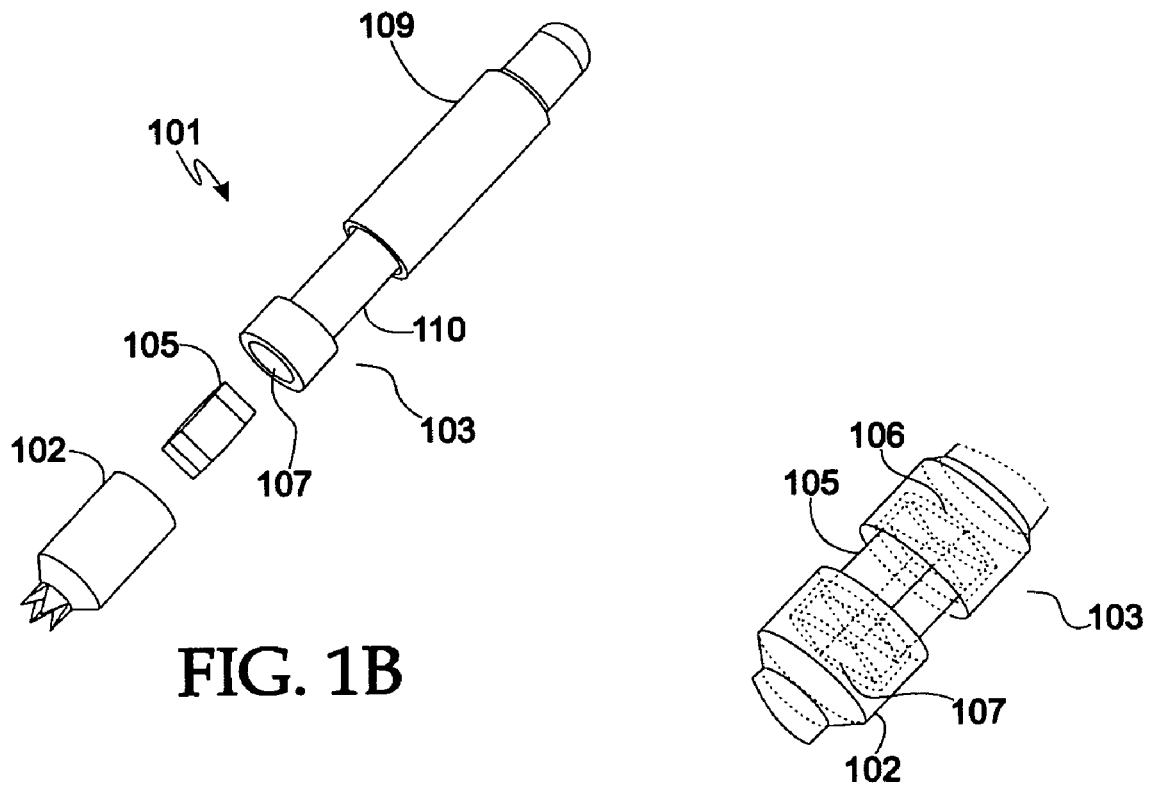
FIG. 1B
FIG. 1C

SIGNAL PROBE AND PROBE ASSEMBLY

BACKGROUND

The evaluation and debugging of high-speed digital circuits and systems often requires measurement and display of signal waveforms. Often, these measurements are made using test equipment such as a logic analyzer, an oscilloscope, or a spectrum analyzer. A portion of a signal from the circuit or system under test (often referred to as the target) is provided to the test equipment via a probe.

There are important considerations when designing a probe. For example, it is desirable for the probe to provide an accurate representation of the target signal to the test equipment. Moreover, it is desirable for the probe not to impact the target signal significantly.

The accuracy of the probe measurement is impacted by a number of factors. One factor is the inductive loading of the probe. Because inductance increases with signal frequency, at high frequencies a probe can have a high impedance. While a high probe impedance has minimal impact on the signal traveling along a target transmission line (target signal) and thus is substantially non-intrusive, there may not be sufficient signal power provided from the target to the test equipment for reliable analysis.

Another factor that can influence the accuracy of the probe measurement is capacitive loading by the probe. The capacitive loading of the target signal by the probe can cause deterioration of the target signal. For example, capacitive loading can decrease the rise time, the fall time, and the bandwidth of the target signal. Thus, the measured signal may not be an accurate representation of the target signal.

There is a need for a signal probe and probe assembly that overcomes at least the shortcomings described above.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 1A is a perspective view of a probe in accordance with an example embodiment.

FIG. 1B is a partially exploded view of the probe of FIG. 1A.

FIG. 1C is an enlarged view of a portion of the probe of FIG. 1A.

DETAILED DESCRIPTION

Figure 2A:
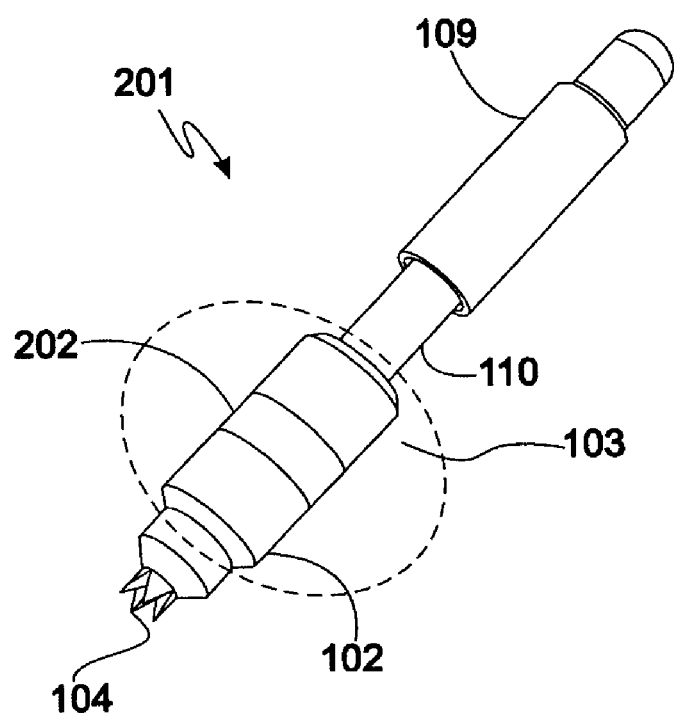
FIG. 2A is a perspective view of a probe in accordance with an example embodiment.

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

FIG. 1A is a perspective view of a probe 101 in accordance with an example embodiment. The probe includes a first section 102 and a second section 103. The first section 102 includes a probe tip 104, which is adapted to engage a target transmission line, a circuit trace, a bus line, or other suitable element on the target. In a specific embodiment, the probe tip 104 is in the shape of a crown, which fosters a reliable connection to the target.

The second section 103 includes a barrel 109 and a plunger 110. The barrel 109 includes a resilient member (not shown), such as a spring, which compresses when the barrel 109 is pressed in the x-direction shown, thereby allowing the probe contact 104 to engage the target. The first section 102 includes a first recess 106 and the second section 103 includes a second recess 107. In a specific embodiment, the first recess 106 and the second recess 107 are back-drilled by a known technique into the first section 102 and the second section 103, respectively. Illustratively, the first recess 106 and the second recess 107 are substantially cylindrical, although other recess shapes are possible.

The probe 101 also includes an electrical element 105 with one end disposed in the first recess 106, a second end disposed in the second recess 107, and an exposed portion between the first and sections 102, 103. The gap between opposing ends of the first section 102 and the second 103, which is commensurate with the exposed portion of the electrical element 105, is relatively small. In a specific embodiment, the gap is approximately 0.0050" (0.12700 mm).

The electrical element 105 is provided at a distance 108 from the tip of the probe 104. This distance 108 is referred to as the stub length, and the portion of the probe 101 between the target and the element 105 is referred to as the stub.

In an example embodiment, the electrical element 105 is a resistor. As detailed herein, the resistor 105 may be a damping resistor useful in probing relatively high frequency electrical target signals.

In another example embodiment, the electrical element 105 is a parallel resistor and capacitor circuit (parallel RC circuit). The parallel RC circuit is useful in a variety of probing applications. For example, in high impedance general purpose probes the resistance is relatively high (e.g., approximately 20.0 kΩ and greater), which is desired for DC loading. However, resistance of this magnitude is too great for high frequency probing. Specifically, the amplitude of the signal to the probe is too small to be useful. Therefore, the capacitor is placed in parallel with the resistor. At high frequencies, the parallel RC impedance is effectively the impedance of the capacitor, which is relatively low at high frequencies. The high frequency signals extracted by the probe have sufficient amplitude for measurement analysis, are less susceptible to noise, and have a greater bandwidth. Thus, in low frequency probing applications, the resistance dominates and provides the desired DC loading; and in high frequency probing applications, the capacitance dominates.

In the following description, the electrical element 105 is a resistor and is referred to as such. It is emphasized that this is merely illustrative and that the RC circuit described as well as other electrical elements, including passive and active elements, may be incorporated into the probe 101 as element 105.

As detailed herein, parasitic loading of the transmission lines of the target by the probe 101 results from the stub of the probe 101 between the resistor 105 and the target. In particular, the impedance of the resistor 105 is chosen to be significantly greater than the characteristic impedance ($Z_o$) of the transmission line(s) of the target. Selecting the impedance of the resistor 105 (also referred to as the damping resistor) to be significantly greater than $Z_o$ effectively renders the impedance of the probe equal to combined impedance of the resistor 105 and the parasitic load of the stub between the resistor 105 and the target.

Reducing the parasitic loading of the stub of the probe 101 significantly improves the frequency response of the probe 101 compared to known probes. In example embodiments, the parasitic loading of the stub is reduced by placing the resistor 105 relatively close to the probe tip 104 by seating the ends of the resistor 105 in the first and second recesses 106, 107. This reduces the stub length 108 and thus reduces the parasitic capacitance and parasitic inductance (parasitic loading) of the stub.

FIG. 1B is a partially exploded view of the probe 101. In a specific embodiment, probe 101 has an outer diameter of approximately 0.02000" (0.50800 mm) and the first and second recesses 106, 107 have a diameter/width of approximately 0.01688" (0.4287 mm). In another specific embodiment, the diameter/width of the first and second recesses 106, 107 are approximately 0.01400" (0.3556 mm).

The diameter/width of the first and second recesses 106, 107 may be chosen to provide an interference fit between the electrical element 105 and the inner walls of the first and second recesses 106, 107. Illustratively, the dimensions of the resistor 105 are chosen so that a gap between the inside walls of the first and second recesses 106, 107 and the resistor 105 is on the order of approximately 0.0010" (0.0254 mm). The relatively tight fit of the resistor 105 in the recesses 106,107 fosters suitable strength and integrity of the probe 101.

In order to provide a durable probe with suitable electrical and magnetic properties, the first and second sections 101, 102 of the probe of the present embodiment and the components thereof are made of an alloy of beryllium and copper, which is plated with successive layers of nickel and gold. Representative thicknesses for the nickel and gold are approximately 0.000050" (0.000127 mm) and approximately 0.000010" (0.000254 mm), respectively.

The beryllium-copper material is chosen for manufacturability/machinability, particularly given the relatively small dimensions of the probe 101 of the present embodiment. Moreover, the beryllium-copper material is chosen for its durability over long-term use. The nickel plating reduces the magnetic and thus inductive properties of the probe, particularly at relatively high target signal frequencies. Finally, the gold layer is provided for its inertness and conductive properties.

FIG. 1C is an enlarged view of a portion of the probe 101 showing the resistor 105 seated in the first recess 106 and the second recess 107. In the present embodiment, each end of the resistor 105 is soldered into respective first and second recesses 106, 107, with the solder joint being along the bottom and sides of the recesses. The soldering may be carried out using a variety of known solder materials and techniques. In general, the solder is chosen for its melting temperature and strength. In a specific embodiment, the solder is an alloy of 65 Sn-25Ag-10Sb. Notably, electrically conductive materials with adhesive properties other than solder may be used. For example, a variety of conductive epoxies may be used to secure the resistor 105.

The solder (or other material) provides the necessary ohmic contact of the resistor 105 to the probe 101. In addition, the solder or other material suitably secures the resistor 105 in the recesses 106, 107 and strengthens the connection of the first section 102, the resistor 105 and the second section 103 to one another. This is beneficial to maintaining the integrity of the probe 101 during repeated use.

Figure 2B:
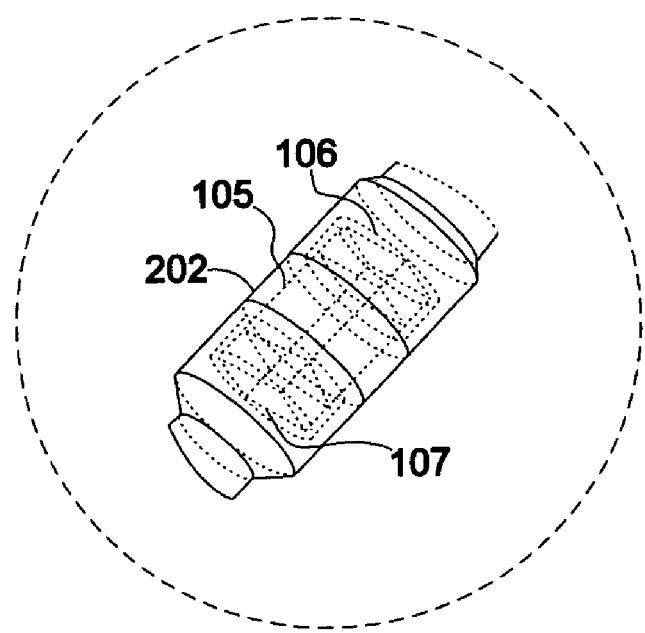
FIG. 2B is an enlarged view of a portion of the probe of FIG. 2A.

FIGS. 2A and 2B show a probe 201 in accordance with another example embodiment. The probe 201 has many features and dimensions in common with the probe 101 described in conjunction with FIGS. 1A-1C. Duplication of the details of these features and dimensions is foregone in order to avoid obscuring the description of the present example embodiment.

The probe 201 includes the first section 102, the second section 103, and the resistor 105 disposed in the first and second recesses 106,107. The resistor 105 is secured into the recesses with an electrically conductive material with adhesive properties as described previously. In addition, an encapsulant material 202 is disposed between the first section 102 and the second section 103, and about the resistor 105. The encapsulant 202 may extend into the first recess 106 and the second recess 107 as shown.

In a specific embodiment, the encapsulant 202 is an epoxy material chosen to strengthen the fastening of the resistor 105 in the recesses 106, 107, and to improve the integrity of the probe 201. Illustratively, the epoxy material has a dielectric constant of less than approximately 5.0. Moreover, the encapsulant 202 has a modulus of elasticity and adhesive strength that provides a shear strength of greater than approximately 500.0 g to the electrical element/probe tip assembly.

Beneficially, the viscosity of the encapsulant 202 is such that the encapsulant flows freely into the first and second recesses 106, 107. During manufacture the encapsulant 202 is applied in the first and second recesses 106, 107 and about the electrical element 105. As noted previously, the opposing ends of the first section 102 and the second section 103 are relatively close to one another. Because the opposing ends of the first and second sections 102, 103 are relatively close to one another, a capillary action of the encapsulant 202 results between the opposing ends. This capillary action and surface tension of the encapsulant 202 results in the filling of the gap between the first and seconds sections 102, 103 of the probe 101 without excess encapsulant's being disposed in the gap. As such, the aggregation of excess encapsulant about the resistor 105 and the first and second sections 102, 103 is substantially prevented. Accordingly, encapsulant 202 is provided in the first and second recesses 106, 107 and in the gap between the first and second sections 102, 103, providing the requisite strength to the probe 101. However, application of excess encapsulant is substantially prevented by the surface tension. As a result, the diameter of the probe 101 is not significantly increased by the encapsulant 202 and thus the pitch of neighboring probes in a multi-probe assembly is not significantly increased by the encapsulant.

As in the example embodiment of FIGS. 1A and 1B, the resistor 105 of the present example embodiment is disposed relatively close to the probe tip 104. Placing the resistor relatively close to the probe tip 104 reduces the parasitic capacitance and parasitic inductance of the probe 201. By reducing the parasitic capacitance and parasitic inductance of the probe 201, the frequency response of the probe 201 is significantly improved compared to known probes.

Figure 3A:
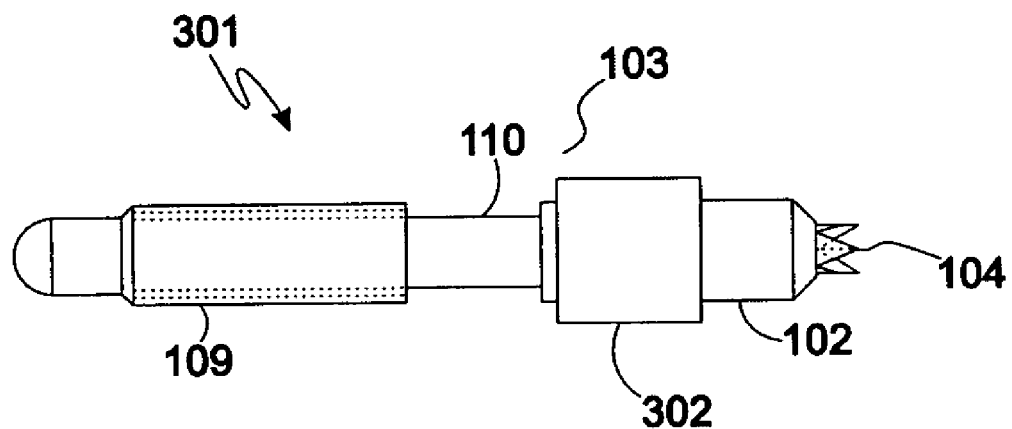
FIG. 3A is a perspective view of a probe in accordance with an example embodiment.
Figure 3B:
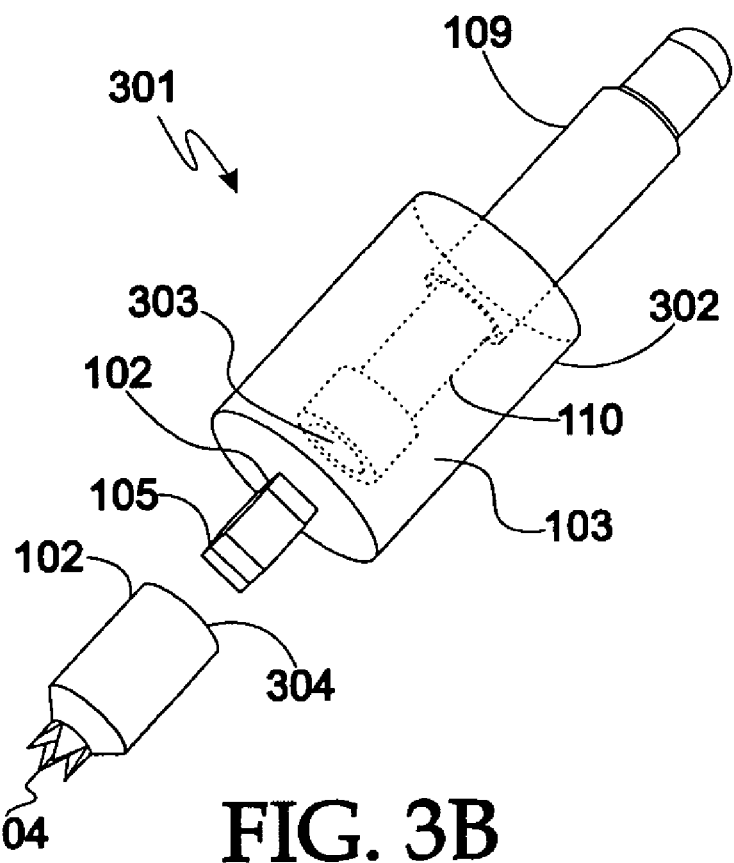
FIG. 3B is a partially exploded view of the probe of FIG. 3A.

FIGS. 3A and 3B show a probe 301 including a sheath in accordance with an example embodiment. The probe 301 has many features and dimensions in common with the probes 101, 201 described in conjunction with FIGS. 1A-2B. Duplication of the details of these features and dimensions is foregone in order to avoid obscuring the description of the present example embodiment.

The probe 301 includes the first section 102, the second section 103 and the resistor 105 disposed between the first section 102 and the second section 103. The resistor 105 may be seated in the first and second recesses 106, 107 as described previously. Alternatively, the recesses 106, 107 are omitted and the resistor 105 is disposed between ends 303 and 304 of the first section 102 and the second sections 103, respectively.

The resistor 105 may be fastened in the first and second recesses 106, 107, or between the first and second sections 102, 103 using an electrically conductive material with adhesive properties, such as solder. Thereafter, a suitable adhesive (not shown), such as epoxy, is applied to portions of the first section 102, the second section 103 and the exposed portion of the resistor 105.

After the adhesive is applied, the sheath 302 is disposed over the resistor 105 and at least a portion of the first section 102 and at least a portion of the second section 103. Illustratively, the sheath 302 is made of a thermoset resin material. In a specific embodiment, the thermoset resin is TORLON® polyamide-imide sold by Solvay Corporation, Brussels, Belgium. In embodiments in which the sheath 302 comprises thermoset resin, after being disposed over the first and second sections 102, 103 and the resistor 105, the sheath 302 is cured by the application of the required heat for such curing. This curing process results in the shrinking of the sheath 302 around the resistor 105 and portions of the first section 102 and the second section 103.

As noted, the first and second recesses 106, 107 are optional in the probe 301. In order to provide the first and second recesses 106, 107, the opposing ends of the first section 102 and the second section 103 each may have a wider diameter than the plunger 110 and the probe tip 104, respectively. The diameter of the probe 101 affects the pitch or spacing of probes in a probe assembly, such as the probe assembly of an example embodiment described herein. As such, the addition of the sheath 302 may result in an unacceptable diameter for specified pitch. For example, one probe assembly specification requires a probe pitch of 0.03937" (1.0000 mm). With the first and second recesses 106, 107, this requires a maximum probe diameter of approximately 0.01600" (0.0.40640 mm) or less. However, providing the sheath 302 over a probe 301 with the recesses in the first and second sections 102, 103 will result in the probe diameter's exceeding the limit for the required pitch. Accordingly, the first and second recesses 106, 107 may be omitted in order that the diameter of the probe is sufficiently small that the pitch of adjacent probes is within the specified pitch of a probe assembly.

Beneficially, the probe 301 provides the resistor 105 at a location that is closer to the probe tip 104 than in known probes. This reduces the inductive and capacitive loading of the probe 301. Moreover, the sheath 302 provides strength and rigidity to the probe structure, making the probe durable. Finally, the use of the sheath eliminates the need to machine recesses in the first and second probe sections 106, 107.

Figure 4A:
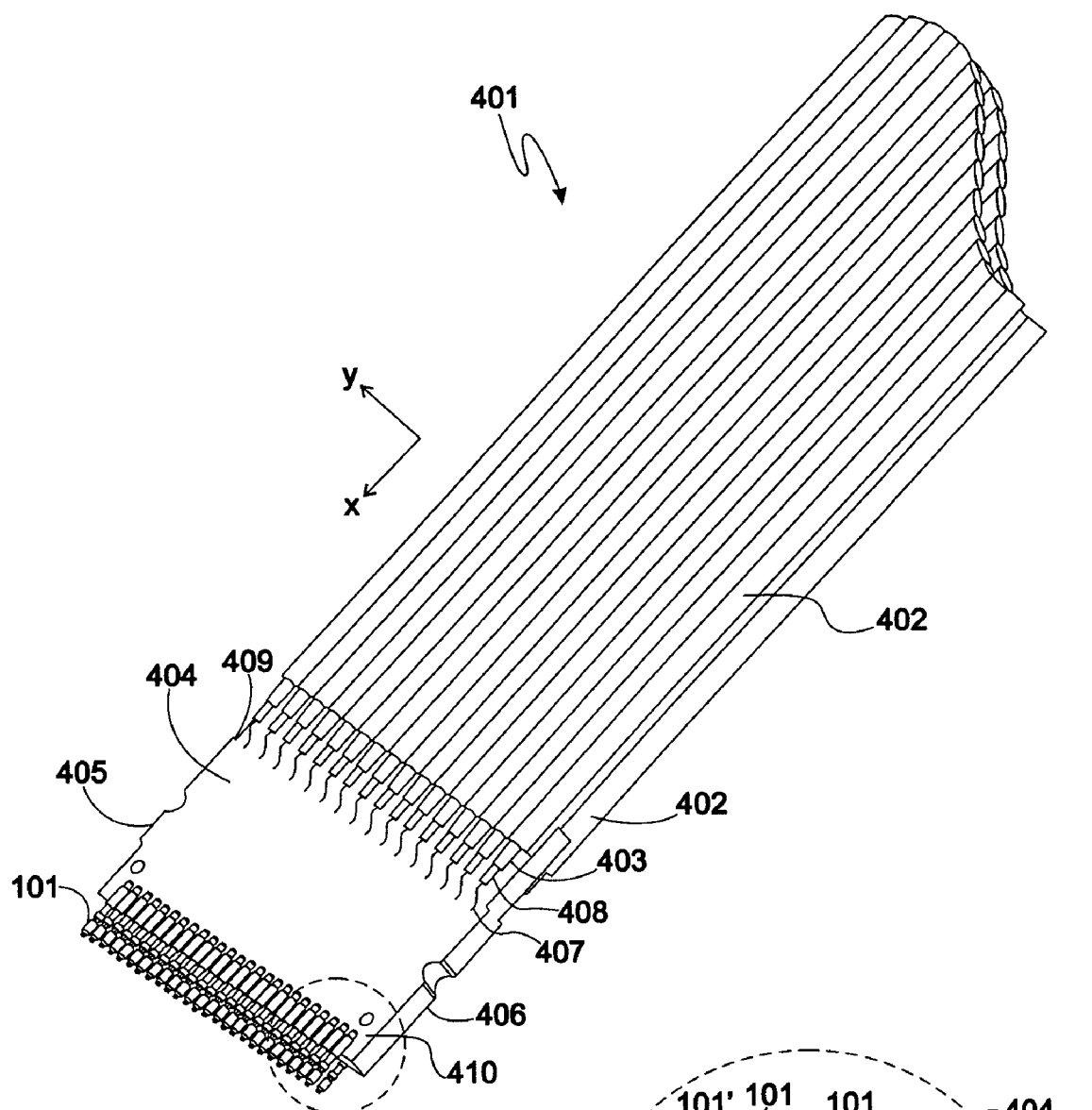
FIG. 4A is a perspective view of a probe assembly in accordance with an example embodiment.
Figure 4B:
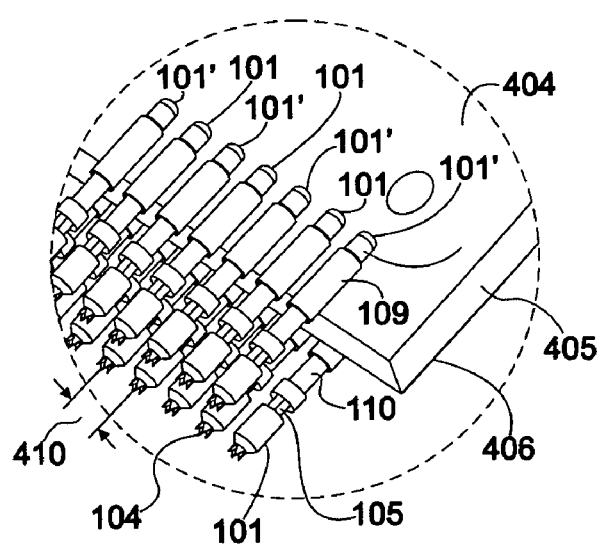
FIG. 4B is an enlarged view of a portion of the probe assembly of FIG. 4A.

FIGS. 4A and 4B show a probe assembly 401 in accordance with an example embodiment. Illustratively, the probe assembly 401 includes a plurality of probes 101, which have been previously described. It is emphasized that probes 201 and 301 may also be used in the probe assembly 401, in addition to or instead of probes 101.

The probe assembly 401 includes ribbons 402 of transmission lines 403, with one ribbon disposed over a top 404 of a substrate 405 and the other ribbon disposed over a bottom 406 of the substrate 405. In specific embodiments, the probes 101 on the top 404 are separated from the probes 101 on the bottom 406 by approximately 0.0750" (1.9050 mm) to approximately 0.03937" (1.0000 mm). In the present embodiment, the transmission lines 403 are coaxial transmission lines. Other types of signal transmission lines may be used, including but not limited to, printed circuit board (PCB) transmission lines and twin axial (twin-ax) cable transmission lines.

Each transmission line 403 includes a signal line 407 and a ground conductor 408. The signal lines 407 and ground conductors 408 are connected to impedance matched transmission lines (not shown) of the top 404 and the bottom 406 at a first end 409 of the substrate 405. The transmission lines of the substrate 405 are connected to respective probes 101 disposed on the top 404 and bottom 406 at a second end 410 of the substrate 405. Signals from the probes 101 are transmitted across the transmission lines of the substrate to the transmission lines 403, which are connected to a testing device (not shown), such as a logic analyzer, or a spectrum analyzer, or an oscilloscope.

The plurality of probes 101 are connected to a target (not shown). The connection may be to a circuit board on the target (referred to as the target board). The connection to the target board may be carried out using an alignment and retention device described in U.S. Pat. No. 6,822,466 to Holcombe, et al., the disclosure of which is specifically incorporated herein by reference. In general, the target may be an electrical component adapted for electrical connections (often referred to as a landing pad). Such targets include, but are not limited to flexible electrical circuits and ceramic circuit boards.

After the connection is made to the target board, application of a force to the substrate 405 in the x-direction engages the barrels 109 and springs of the probes 101 resulting in the engagement of the probes 101 to the target signal transmission lines.

FIG. 4B shows a portion of the probe assembly. In order to make efficient use of the allocated space for probing on the target, and to make necessary connection to transmission lines on the target, the probes 101 are spaced in relatively close proximity to one another. In a specific embodiment, the spacing 410 from the center of one probe 101 to the next probe 101 (also known as the pitch) is in the range of approximately 0.030" (0.762 mm) to approximately 0.040" (1.016 mm). Moreover, and particularly when probing signals at relatively high frequencies/transmission rates, it is often necessary to connect some of the probes 101' to ground in order to provide isolation from one signal to neighboring signals. In a specific embodiment, probes 101 are connected to signal transmission lines of the substrate 405 and alternate probes 101' are connected to ground connections of the substrate 405. Illustratively, but not necessarily, the probes 101' connected to ground do not include resistors 105.

As described previously, it is useful to tap a portion of the target signal with the probe 101, while not significantly impacting the characteristics of the target signal as it travels along the transmission line(s) of the target. In order to minimize the impact of the probes 101 and probe assembly 401 on the signal integrity of the target during probing, a damping resistor (i.e., resistor 105) is disposed between the target and the transmission lines 404. This damping resistor has a resistance that is significantly greater than the characteristic impedance $Z_o$ of the target transmission lines. Thus, reflections of signals in the target transmission lines and other undesirable affects are mitigated by the damping resistor. However, the greater the impedance of the damping resistor, the smaller the amplitude of the signal that is tapped by the probes 101 for measurement and analysis. Accordingly, the impedance of the damping resistor must be significantly greater than that of the characteristic impedance of the transmission lines of the probe to minimize to the extent possible the influence of the probes on the target signal, but not too great that there is insufficient signal sampling. As an example, the damping resistor can have an impedance that is approximately four times that of the characteristic impedance to achieve a reasonable balance between sufficient signal sampling and maintaining target signal integrity. For purposes of illustration, in a specific embodiment, the transmission lines of the target have a characteristic impedance of approximately 50 Ω and the resistor 105 has a resistance of approximately 200 Ω.

Figure 5:
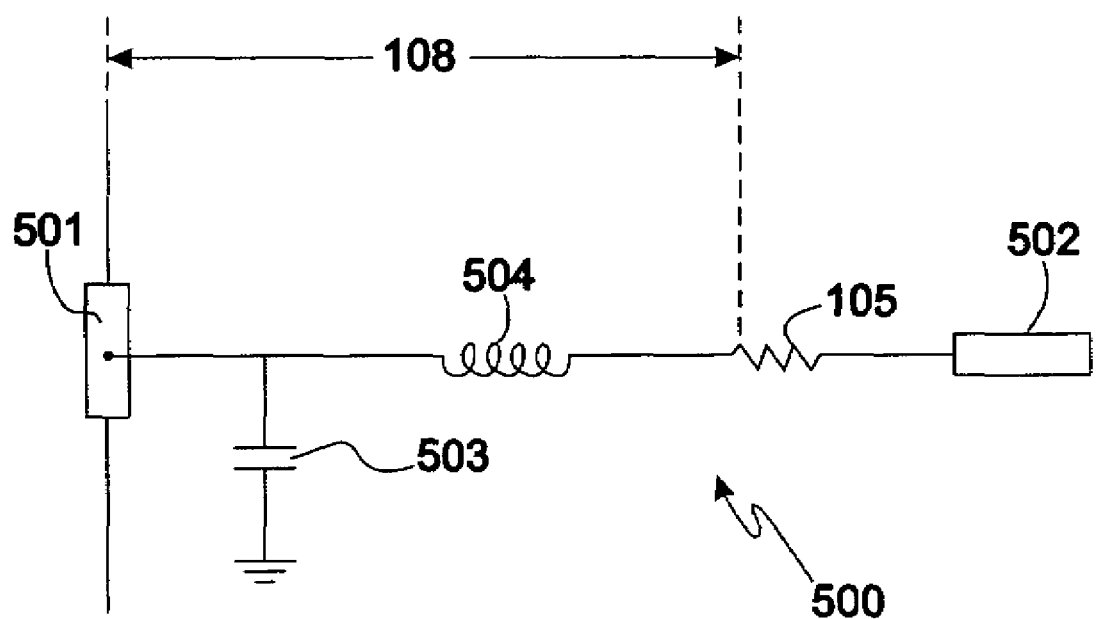
FIG. 5 is an equivalent circuit diagram of a probe in accordance with an example embodiment.

FIG. 5 shows an equivalent circuit 500 of probes 101, 201, 301 between a target transmission line 501 to a transmission line 502, which is illustratively connected to testing equipment (not shown). The equivalent circuit includes a parasitic capacitance 503 of the stub in parallel with a parasitic inductance 504 of the stub. The parasitic inductance 504 is in series with the damping resistor 105, which is connected to the transmission line 502. The parasitic capacitance 503 and the parasitic inductance 504 represent the parasitic loading of the stub between the resistor 105 and the target transmission line 501.

Parasitic loading by the stub can have a deleterious impact on the target signals. For example, reflections of target signals traveling along the target transmission lines at the stub due to parasitic loading can impact the target signal quality. Moreover, the bandwidth of the target signal is inversely proportional to the (parasitic) capacitance 503. Thus, the parasitic capacitance 503 can limit the bandwidth via a phenomenon often referred to as capacitive roll off.

Parasitic loading by the stub also impacts the function of the probe. In the equivalent circuit 500, the parasitic capacitance 503 is in parallel with the series combination parasitic inductance 504 and the damping resistor 105. Impedance varies inversely with the capacitance and the frequency of the signal. At higher frequencies, the impedance of the parasitic capacitance 503 is relatively small. Thus, the greater the parasitic capacitance 503, the greater the amount of signal power that is transmitted to ground. This reduces the signal power to the transmission line 502, making measurements by the test equipment less than optimal. Moreover, impedance is directly proportional to inductance and the frequency. Thus, the contribution of the parasitic inductance 504 to the probe impedance increases significantly as the frequency increases, thereby reducing the signal to the transmission line 502. Thus, it is useful to reduce to the extent possible the parasitic capacitance 503 and the parasitic inductance 504 between the target and the transmission lines of the substrate.

In example embodiments, the parasitic capacitance 503 and parasitic inductance 504 of the stub are substantially reduced compared to known probes by reducing the stub length (distance 108). In particular, the stub length of the probes 101, 201, 301 is reduced by locating the resistor 105 closer to the probe tip 104 as described in detail previously. In a specific embodiment, the distance 108 from the probe tip 104 to the end of the resistor 105 in the first recess 106 of probes 101, 201, 301 is in the range of approximately 0.030" (0.762 mm) to approximately 0.040" (1.016 mm). In another specific embodiment, the probe 301 does not include the first recess 106 or the second recess 107. In this embodiment, the distance from the probe tip 104 to the resistor 105 is also approximately 0.030" (0.762 mm) to approximately 0.040" (1.016 mm).

By reducing the stub length 108, the parasitic inductance 504 becomes substantially immeasurable and the parasitic capacitance 503 is approximately 1.0 femto Farad (fF) to approximately 450.0 fF over a frequency range of approximately DC (0 Hz) to approximately 10.0 GHz. In a specific embodiment, the parasitic capacitance 503 is approximately 20.0 fF to approximately 280.0 fF over a frequency range of approximately 1.0 GHz to approximately 10.0 GHz.

Figure 6:
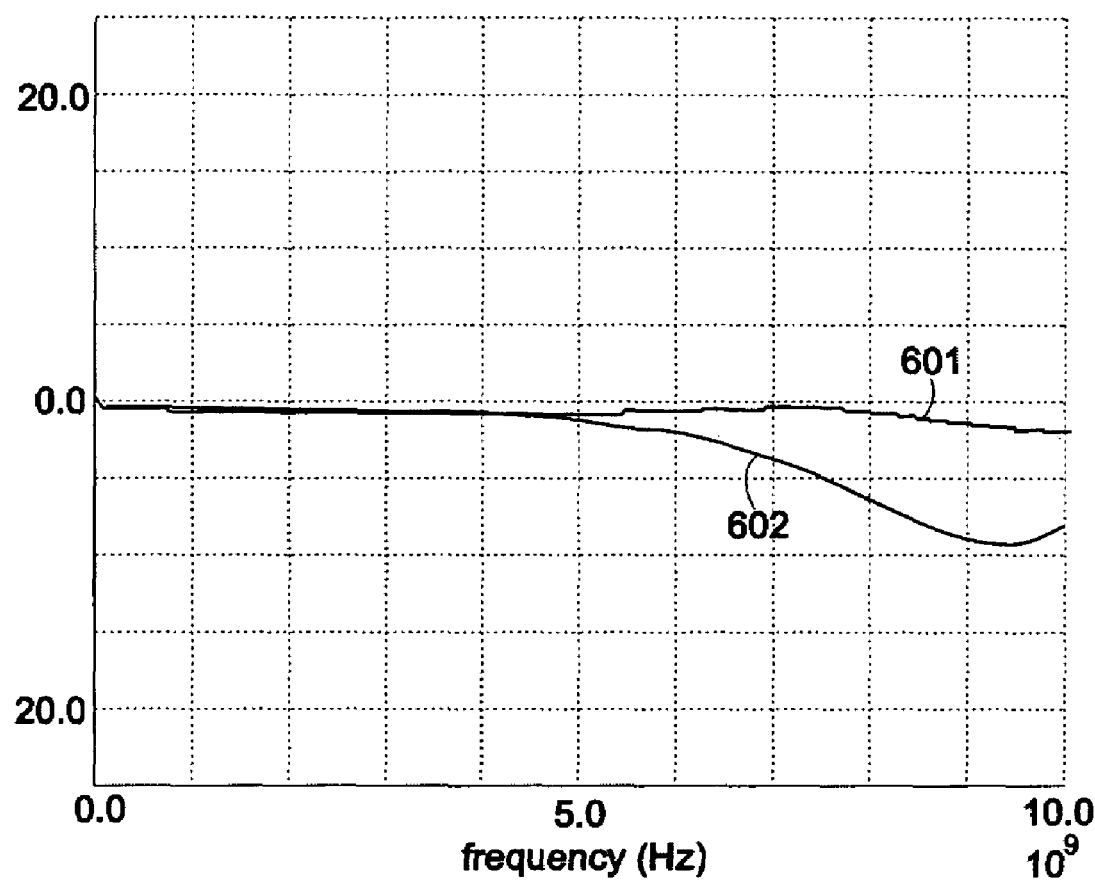
FIG. 6 is a graphical representation of the transmission coefficients (S21) versus frequency for a probe in accordance with an example embodiment, and a known probe.

FIG. 6 is a graphical representation of the transmission coefficient (S21) versus frequency of a target signal traveling along a target transmission line, which has a probe connected thereto. Notably, the S21 parameter is ideally 0 dB at all frequencies when no probe is connected. Curve 601 represents the S21 parameter for a probe in accordance with example embodiments described previously. S21 of curve 601 remains at approximately −1.0 dB to approximately 8.0 GHz. From approximately 8.0 GHz to approximately 10.0 GHz, the S21 parameter of curve 601 diminishes to approximately −3.0 dB representing a slight loss in signal to the probe.

Curve 602 represents the S21 parameter with a known probe connected to the target transmission line. The S21 parameter remains nearly constant until approximately 5.0 GHz, where the S21 parameter decreases to approximately −8.0 dB at approximately 9.3 GHz. This decrease is because at higher frequencies the parasitic capacitance 503 provides a relatively low impedance to ground. As described previously, this reduces the power of the signal in the target transmission line and the probed signal to the test equipment. At approximately 9.5 GHz, the parasitic inductance 504 begins to dominate resulting in less signal loss in the target transmission line, but inappreciable signal at the test equipment.

Clearly, the S21 parameter of curve 601 beneficially provides a nearly constant signal power/amplitude to the test equipment over a relatively wide frequency range without significantly impacting the signal in the target transmission line.

FIGS. 7A-7E are graphs of the voltage versus time for a test signal traveling along a target transmission line.

Figure 7B:
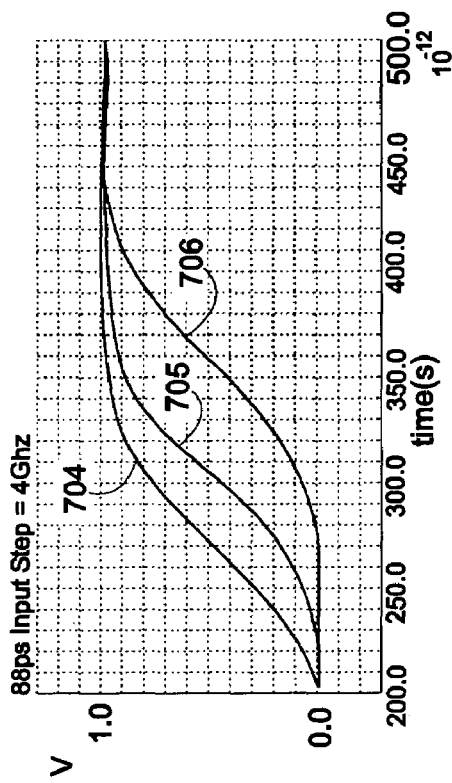
FIGS. 7A-7E are graphical representations of amplitude versus time of samples of target signals garnered using known probes and using probes in accordance with example embodiments.
Figure 7D:
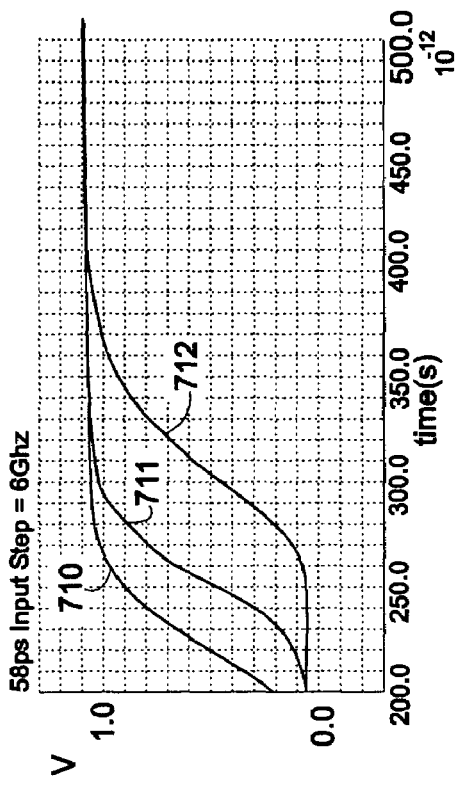
Figure 7A:
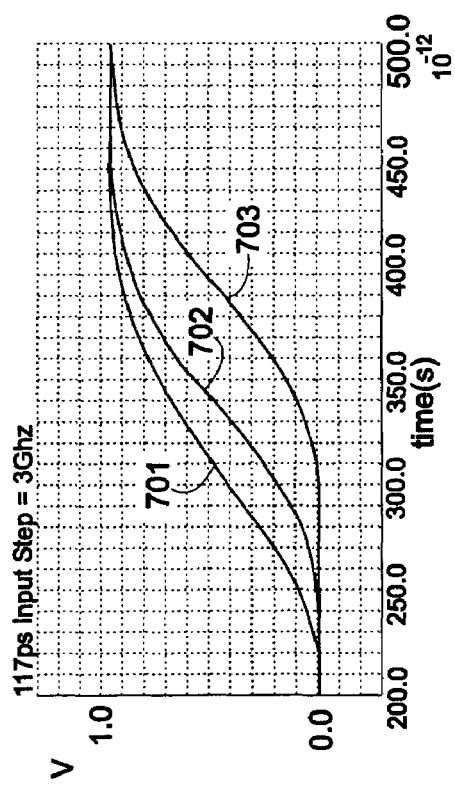

FIG. 7A shows the rise time of a signal having a frequency of 3.0 GHz. Curve 701 is the signal with no probe connected to the target transmission line and provides a basis for comparison. Curve 702 is the signal with a probe of the example embodiments connected to the target transmission line. Curve 703 is the signal with a known probe connected to the target transmission line. Curves 702 and 703 show the impact of parasitic capacitance on the rise/fall time of the signal. The probe of the example embodiments provides a parasitic capacitance of approximately 280 fF, whereas the known probe provides a parasitic capacitance of approximately 450 fF.

FIG. 7B shows the rise time of a signal having a frequency of 4.0 GHz. Curve 704 is the signal with no probe connected to the target transmission line and provides a basis for comparison. Curve 705 is the signal with a probe of the example embodiments connected to the target transmission line. Curve 706 is the signal with a known probe connected to the target transmission line. Curves 705 and 706 show the impact of parasitic capacitance on the rise/fall time of the signal. The probes of the example embodiments provide a parasitic capacitance of approximately 280 fF, whereas the known probe provides a parasitic capacitance of approximately 700 fF.

Figure 7C:
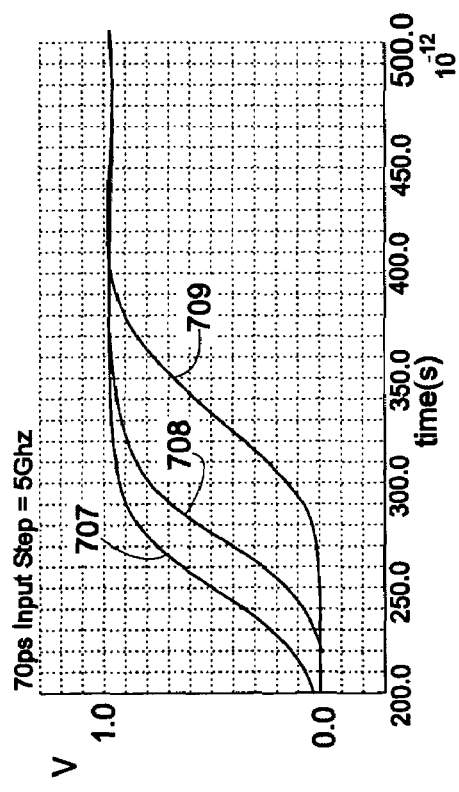

FIG. 7C shows the rise time of a signal having a frequency of 5.0 GHz. Curve 707 is the signal with no probe connected to the target transmission line and provides a basis for comparison. Curve 708 is the signal with a probe of the example embodiments connected to the target transmission line. Curve 709 is the signal with a known probe connected to the target transmission line. Curves 708 and 709 show the impact of parasitic capacitance on the rise/fall time of the signal. The probes of the example embodiments provide a parasitic capacitance of approximately 280 fF, whereas the known probe provides a parasitic capacitance of approximately 900 fF.

FIG. 7D shows the rise time of a signal having a frequency of 6.0 GHz. Curve 710 is the signal with no probe connected to the target transmission line and provides a basis for comparison. Curve 711 is the signal with a probe of the example embodiments connected to the target transmission line. Curve 712 is the signal with a known probe connected to the target transmission line. Curves 711 and 712 show the impact of parasitic capacitance on the rise/fall time of the signal. The probes of the example embodiments provide a parasitic capacitance of approximately 280 fF, whereas the known probe provides a parasitic capacitance of approximately 1000 fF.

Figure 7E:
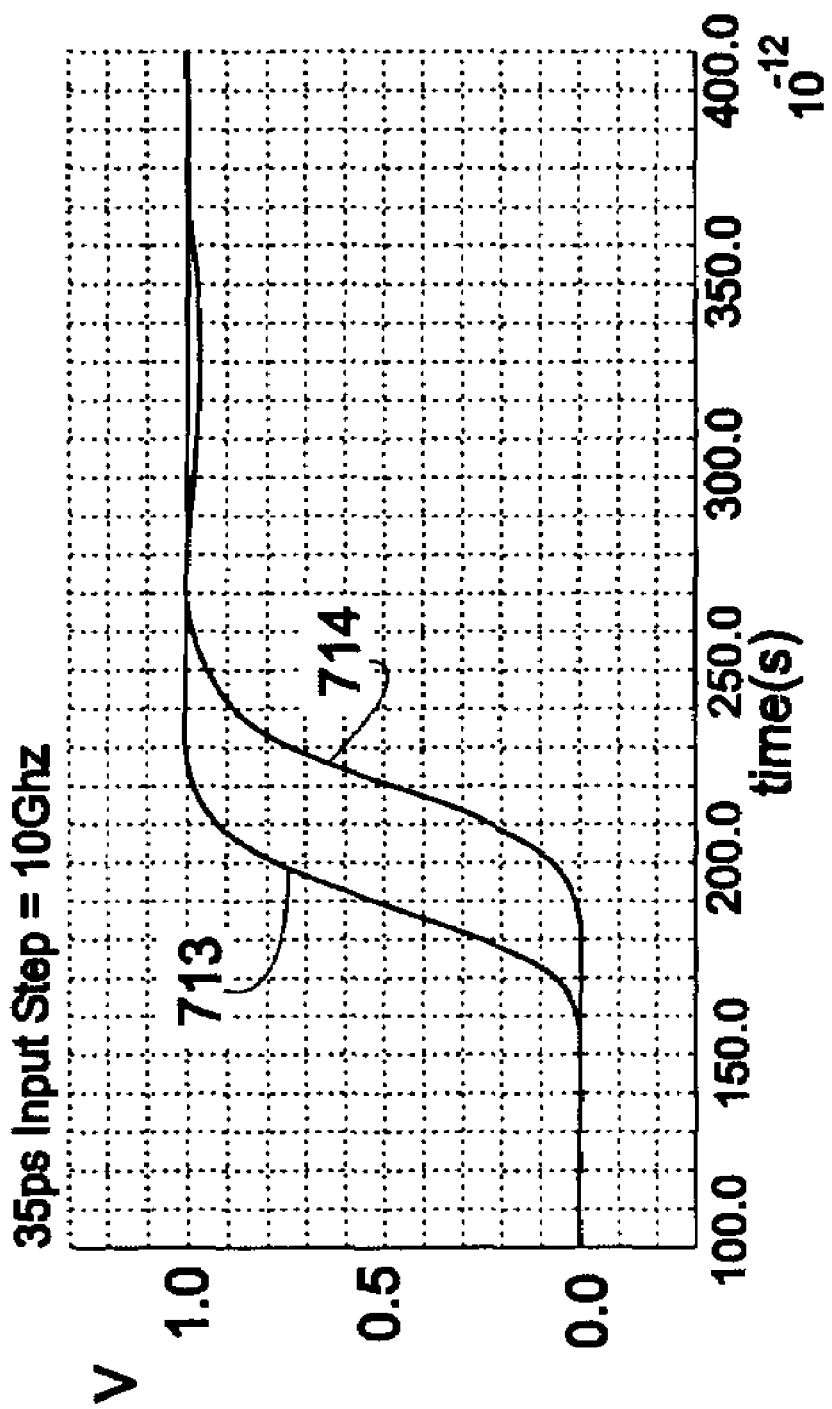

FIG. 7E shows the rise time of a signal having a frequency of 10.0 GHz. Curve 713 is the signal with no probe connected to the target transmission line and provides a basis for comparison. Curve 714 is the signal with a probe of the example embodiments connected to the target transmission line. Curve 714 shows the impact of parasitic capacitance on the rise/fall time of the signal. The probes of the example embodiments provide a parasitic capacitance of approximately 280 fF.

FIGS. 7A-7E show that the impact by the example probes on the signal transmitted along the target transmission line is minimal. In particular, the parasitic capacitance has some impact on the rise/fall times of the signal, but significantly less impact than known probes. Moreover, the parasitic capacitance of the stub of the probe of the example embodiments is substantially constant across a relatively wide wavelength range. This provides for more reliable test results. In contrast, the parasitic capacitance of known probes increases significantly with frequency.

In accordance with illustrative embodiments described, a probe and probe assembly testing device are adapted to provide signals to test equipment with improved parasitic loading. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A probe assembly, comprising:
    a substrate having a first end and a second end;
    a plurality of transmission lines connected to the first end;
    a first plurality of probes; and
    a second plurality of probes connected to the second end, each of the second plurality of probes further comprising:
        a first section having a first recess and a probe contact;
        a second section having a second recess; and
        an electrical element having a first end disposed in the first recess and a second end disposed in the second recess fastened between the first section and the second section.

2. A probe assembly as recited in claim 1, wherein the electrical element is a resistor.

3. A probe assembly as recited in claim 1, wherein the electrical element is a parallel resistor-capacitor circuit.

4. A probe assembly as recited in claim 1, wherein the first plurality of probes are connected to ground.

5. A probe assembly as recited in claim 1, wherein the second plurality of probes are connected to respective transmission lines of the substrate.

6. A probe assembly as recited in claim 1, further comprising an encapsulant, which substantially surrounds the electrical element.

7. A probe assembly as recited in claim 1, further comprising a sheath disposed about the electrical element, at least a portion of the first section, and at least a portion of the second section.

8. A probe assembly as recited in claim 1, wherein the each of the second plurality of probes has a capacitance in the range of approximately 20.0 femto farads (fF) to approximately 280.0 fF over a frequency range of approximately 0.0 GHz to approximately 10.0 GHz.

* * * * *